United States Patent
Pawlak (10) Patent No.: US 9,704,962 B1
(45) Date of Patent: Jul. 11, 2017

(54) HORIZONTAL GATE ALL AROUND NANOWIRE TRANSISTOR BOTTOM ISOLATION

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/970,661

(22) Filed: Dec. 16, 2015

(51) Int. Cl.
| | |
|---|---|
| *H01L 27/12* | (2006.01) |
| *H01L 29/423* | (2006.01) |
| *H01L 29/78* | (2006.01) |
| *H01L 29/66* | (2006.01) |
| *H01L 29/06* | (2006.01) |
| *H01L 21/308* | (2006.01) |

(52) U.S. Cl.
CPC .... *H01L 29/42392* (2013.01); *H01L 21/3081* (2013.01); *H01L 29/0673* (2013.01); *H01L 29/66795* (2013.01); *H01L 29/785* (2013.01)

(58) Field of Classification Search
CPC .................... H01L 29/42392; H01L 29/66795
See application file for complete search history.

(56) References Cited

U.S. PATENT DOCUMENTS

| | | | | |
|---|---|---|---|---|
| 2014/0264280 A1* | 9/2014 | Kim | ...................... | H01L 29/785 257/29 |
| 2014/0339611 A1* | 11/2014 | Leobandung | ..... | H01L 29/78609 257/288 |
| 2015/0102287 A1* | 4/2015 | Wang | .................... | H01L 29/775 257/26 |

OTHER PUBLICATIONS

"Silicon Vertically Integrated Nanowire Field Effect Transistors", Nano Letters, 2006 vol. 6, No. 5, 973-977, Josh Goldberger, et al.
"Gate-All-Around Silicon Nanowire MOSFETs on Bulk Substrate", 16th Korean Conference on Semiconductors, 2009, 648-649, Jin-Woo Han, et al.

* cited by examiner

*Primary Examiner* — Trung Q Dang
*Assistant Examiner* — Wasiul Haider
(74) *Attorney, Agent, or Firm* — Hesin Rothenberg Farley & Mesiti, P.C.

(57) ABSTRACT

A method of forming a GAA MOSFET includes providing a substrate having source, drain and channel regions, the substrate doped with one of a p-type and an n-type dopant. Disposing an etch stop-electric well (ESEW) layer over the substrate, the ESEW layer doped with the other of the p-type and the n-type dopant. Disposing a sacrificial layer over the ESEW layer, the sacrificial layer doped with the same type dopant as the substrate. Disposing a channel layer over the sacrificial layer. Patterning a fin out of the ESEW layer, sacrificial layer and channel layer in the channel region. Selectively etching away only the sacrificial layer of the fin to form a nanowire from the channel layer of the fin while the ESEW layer of the fin functions as an etch stop barrier to prevent etching of trenches in the substrate.

13 Claims, 11 Drawing Sheets

HORIZONTAL GATE ALL AROUND NANOWIRE TRANSISTOR BOTTOM ISOLATION

TECHNICAL FIELD

The present invention relates to semiconductor devices and methods of fabricating the same. More specifically, the invention relates to various methods of forming nanowire channels in gate-all-around (GAA) MOSFETs.

BACKGROUND

With constant down-scaling and increasingly demanding requirements to the speed and functionality of ultra-high density integrated circuits, conventional planar metal-oxide-semiconductor field effect transistors (MOSFETs) face increasing challenges with such issues as scaling of gate oxide thickness and electrostatic control of the gate electrode over the channel region. Fin field effect transistors (FinFETs) have exhibited improved control over a planar gate MOSFET design by wrapping the gate electrode over three sides of a fin-shaped channel.

GAA MOSFETs are similar to FinFETs but have the potential of even greater electrostatic control over the channel because the gate electrode completely surrounds the channel. In a GAA MOSFET, the channel region is essentially a nanowire. The nanowire channel typically has a thickness (or diameter) in the tens of nanometers (nm) or less and has an unconstrained length. The nanowire channel is suspended generally horizontally between, and anchored to, the much larger source and drain regions of the GAA MOSFET.

GAA MOSFETs can be fabricated on a bulk silicon substrate utilizing fully compatible CMOS technology. A typical manufacturing method of forming the channel regions in a GAA MOSFET involves epitaxially growing a stack (epi-stack) of sacrificial layers sandwiched between channel layers on top of a bulk substrate. The sacrificial layers and channel layers are composed of two different materials so that selective etching can remove the sacrificial layers.

By way of example, an epi-stack can be formed of alternating silicon (Si) and silicon germanium (SiGe) layers, wherein the Si layers are the sacrificial layers and the SiGe layers are the channel layers. The Si layers can then be removed by selective etching (for example via a wet etching process such as a TMAH), which also inadvertently recesses trenches into the bulk substrate due to the similarity of materials composing the sacrificial layers and the substrate. The SiGe layers can subsequently be formed into the nanowire channels suspended over the trenches. A thin gate dielectric is then disposed around the SiGe nanowire channels and over the recessed trenches of the substrate. Metal is then disposed over the dielectric to form the metal gate electrode of the GAA MOSFET.

Problematically however, it is difficult to control the inadvertent etching of the recessed trenches under the nanowire channels. This uncontrolled etch introduces trench to trench variations and an undesired roughness at the bottoms of the trenches, which can detrimentally affect device performance. Additionally, the thin gate dielectric deposition does not always sufficiently isolate the metal gate from the substrate, which can lead to shorts across the gate dielectric from electrode to substrate.

Accordingly, there is a need for a method of forming nanowire channels in GAA MOSFETs, which provides better control of the etching process during removal of sacrificial layers with little or no trench formation. Moreover, there is a need for a method of forming nanowire channels, which prevents electrical shorts across the gate dielectric.

BRIEF DESCRIPTION

The present invention offers advantages and alternatives over the prior art by providing a GAA MOSFET and methods of making the same, wherein the MOSFET includes an etch stop-electric well (ESEW) layer disposed over a substrate. The ESEW layer functions as an etch stop barrier to prevent etching of trenches in the substrate during an etching removal process of any sacrificial layers when making the MOSFET. The ESEW layer additionally provides an electric barrier against potential shorts across the gate dielectric by providing an additional p-n or n-p barrier at the common boundary between ESEW layer and substrate.

A method of making a GAA MOSFET in accordance with one or more aspects of the present invention includes providing a substrate having source, drain and channel regions for a GAA MOSFET, the substrate being doped with one of a p-type and an n-type dopant. An etch stop-electric well (ESEW) layer is then disposed over the substrate, the ESEW layer is doped with the other of the p-type and the n-type dopant. A sacrificial layer is disposed over the ESEW layer, the sacrificial layer is doped with the same type dopant as the substrate. A channel layer is disposed over the sacrificial layer. The method further includes patterning a fin out of the ESEW layer, sacrificial layer, and channel layer in the channel region. Additionally the method includes selectively etching away only the sacrificial layer of the fin to form a nanowire from the channel layer of the fin while the ESEW layer of the fin functions as an etch stop barrier to prevent etching of trenches in the substrate.

In another exemplary embodiment of the invention, a GAA MOSFET includes a substrate doped with one of an n-type and a p-type dopant. An etch stop-electric well (ESEW) layer is disposed over the substrate. The ESEW layer is doped with the other of the n-type and p-type dopant and is composed of a different material than the substrate. The GAA MOSFET also includes a source, drain and channel region disposed over the ESEW layer, the channel region having a nanowire channel connected between the source and drain regions. A gate dielectric coating is disposed over the nanowire channel and the ESEW layer in the channel region. A gate metal is disposed over the gate dielectric coating in the channel region to form a gate electrode of the GAA MOSFET. The ESEW layer is free of any trenches under the nanowire channel.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-5 illustrate various exemplary embodiments of a prior art GAA MOSFET and methods of making the same.

Figure 1:
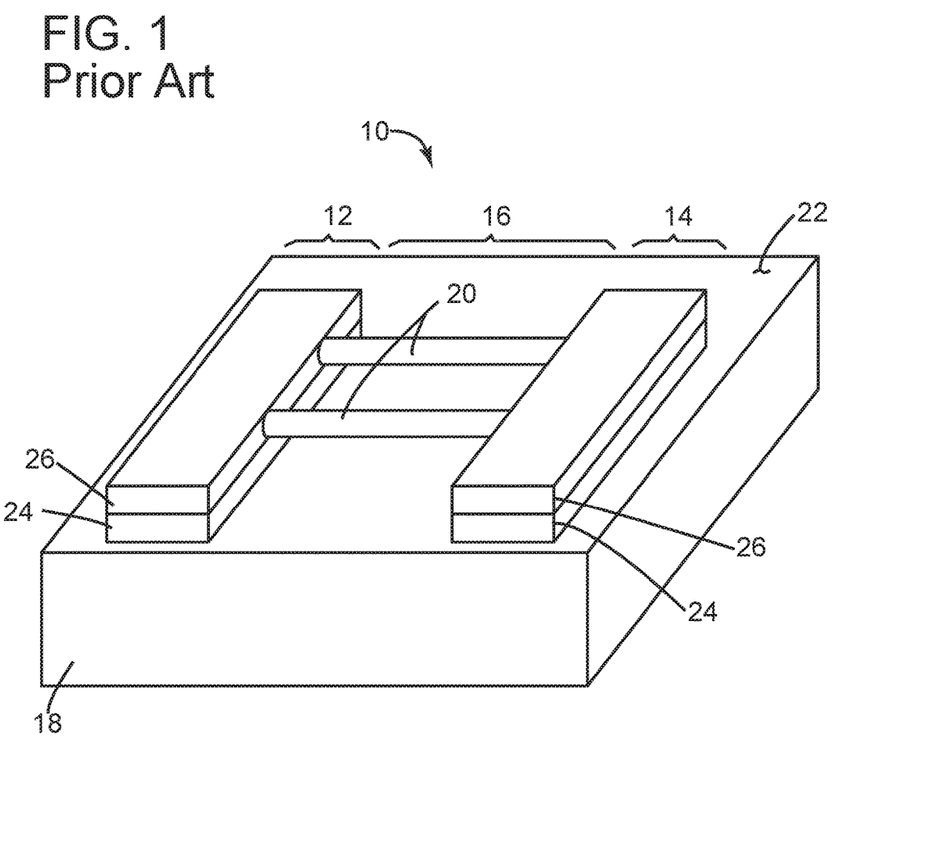
FIG. 1 is perspective view of an exemplary prior art GAA MOSFET structure.

Referring to FIG. 1, a simplistic perspective view of an exemplary prior art GAA MOSFET structure 10 is presented. GAA MOSFET 10 includes a source region 12, a drain region 14 and a channel region 16 embedded in a substrate 18.

The source 12 and drain 14 regions are shown as planar in shape, but can be other shapes as well, such as in the form of a fin to make the MOSFET 10 essentially a FinFET. In this exemplary embodiment, the channel region 16 includes a pair of nanowire channels 20 extending horizontally relative to a top planar surface 22 of the substrate 18. For simplicity purposes, the gate dielectric and all-around gate electrode, which surround the nanowire channels 20, are not shown. The gate electrode is operable to control electric conduction through the nanowire channels 20 from source 12 to drain 14 as is well known.

Though this embodiment illustrates a pair of nanowire channels 20, any number of such channels may be included in the channel region 16. Moreover, the nanowire channels may be oriented in a row (as is shown) extending horizontally across the planar surface 22 of the substrate 18, or stacked vertically in columns extending vertically normal to the planar surface 22.

During manufacture, the source 12, drain 14 and nanowire channels 16 are typically patterned from an alternating plurality of epitaxially grown sacrificial layers 24 and channel layers 26 disposed over the surface 22 of the substrate 18. During the manufacturing process, the sacrificial layer 24 is removed, generally by a wet etch process such as with a tetra-methyl ammonium hydroxide (TMAH) solution, in the channel region 16. The remaining channel layer 26 is then further patterned to form the nanowire channels 20. Again, for purposes of simplicity, this embodiment only shows one sacrificial layer 24 and one channel layer 26, but any number of such pairs may be utilized to form a stacked column of any number of nanowire channels 20.

Figure 2A:
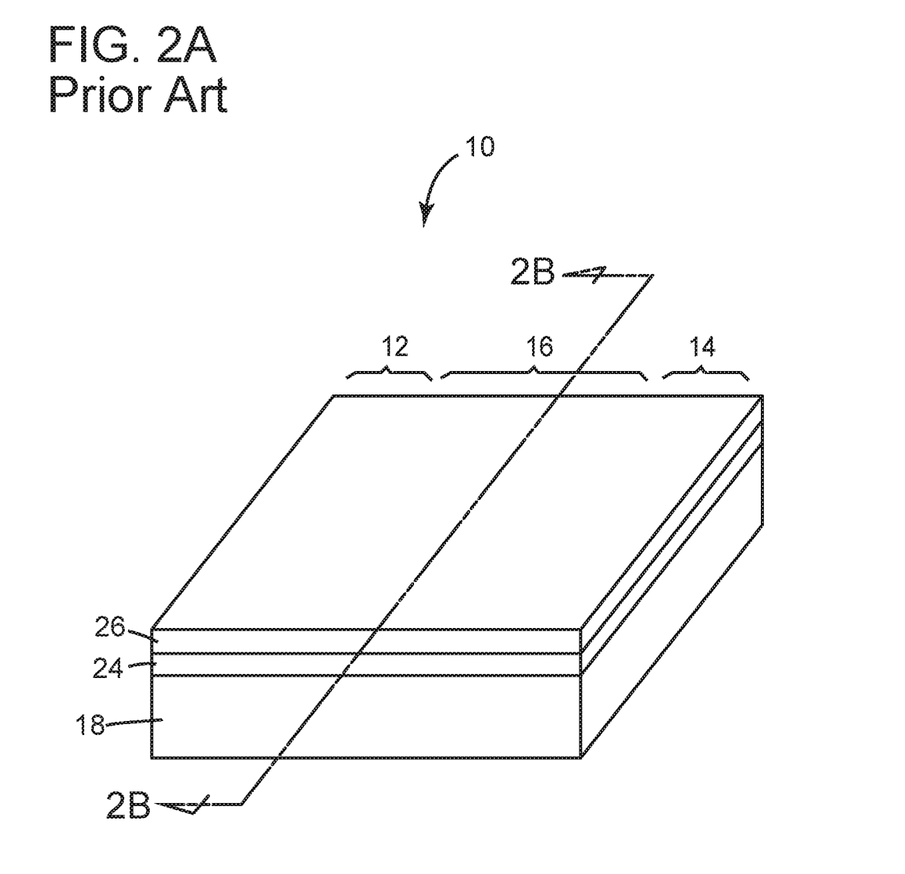
FIG. 2A is a perspective view of the prior art GAA MOSFET structure of FIG. 1 at an intermediate stage of manufacturing.
Figure 2B:
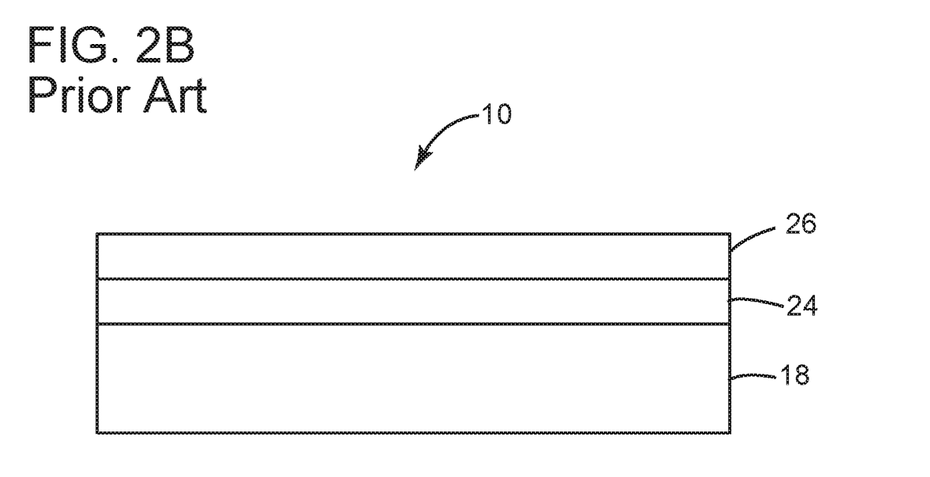
FIG. 2B is a cross sectional view of prior art FIG. 2A taken along the sectional line 2B-2B.

Referring to FIG. 2A, a simplified perspective view of the prior art GAA MOSFET structure 10 of FIG. 1 at an intermediate stage of manufacturing is presented. Referring also to FIG. 2B, a cross sectional view of FIG. 2A taken along the sectional line 2B-2B is also presented.

In FIGS. 2A and 2B, the sacrificial layer 24 and channel layer 26 have been epitaxially grown over substrate 18 to form an epi-stack. The two layers 24, 26 must be of different materials since one layer (i.e., the sacrificial layer 24) will be selectively removed by selective etching. In this example, the substrate 18 is silicon (Si), the sacrificial layer 24 is also Si and the channel layer 26 is silicon germanium (SiGe).

At this stage of manufacture, the source region 12, the drain region 14 and the channel region 16 include only unpatterned portions of the epitaxially grown Si sacrificial layer 24 disposed over the Si substrate 18, and the epitaxially grown SiGe channel layer 26 disposed over the sacrificial layer. The cross sectional view in FIG. 2B is taken through the channel region 16.

Figure 3:
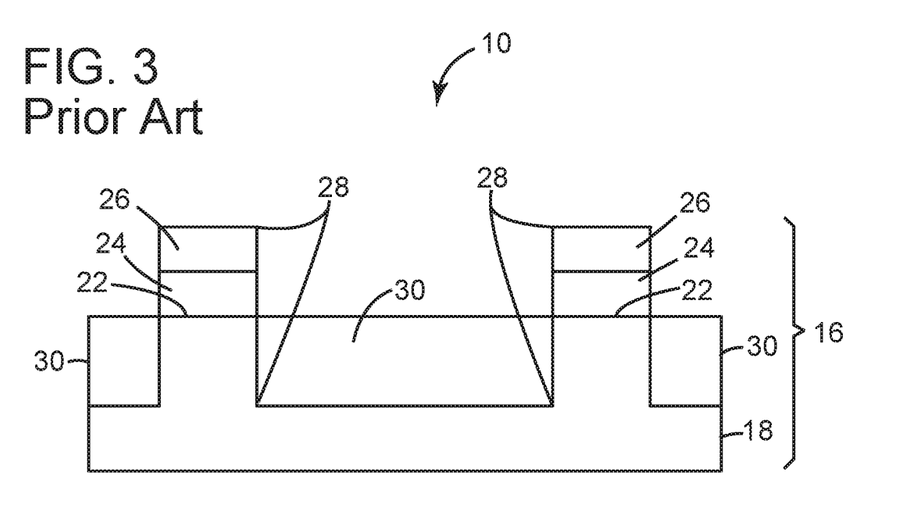
FIG. 3 is the cross sectional view of prior art FIG. 2B further patterned in the channel region to form a pair of fins.

Referring to FIG. 3, the GAA MOSFET structure 10 has been further patterned in the channel region 16 to form a pair of fins 28 out of the SiGe channel layer 26, the Si sacrificial layer 24 and a portion of substrate 18. One or more dielectric materials (such as silicon dioxide) are deposited in trenches and polished down to the top surface 22 of the substrate 18 to form a plurality of shallow trench isolation (STI) layers 30. The STI layers 30 extend along the length of the fins 28 to prevent current leakage between the nanowire channels that are to be formed in the fins.

Figure 4:
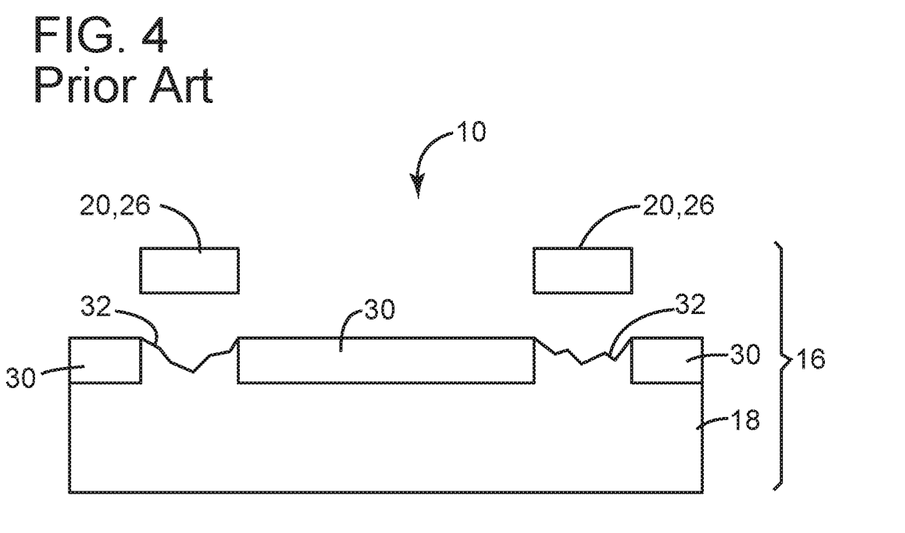
FIG. 4 is the cross sectional view of prior art FIG. 3 after selective removal of sacrificial layers.

Referring to FIG. 4, a wet etching process (such as TMAH etching) is utilized to selectively remove the remainder of the sacrificial layer 24 from under the portion of channel layer 26 that is in the channel region 16. The now suspended portions of the channel layer 26 in the channel region 16 function as the nanowire channels 20 (best seen FIG. 1).

Problematically however, because the substrate 18 material and sacrificial layer 24 material are generally very similar (in this exemplary case they are both exactly the same silicon material), the etching process inadvertently recesses trenches 32 into the substrate 18. This uncontrolled etching process forms rough irregular bottoms to the trenches 32, which varies from trench to trench and can detrimentally affect device performance.

Figure 5:
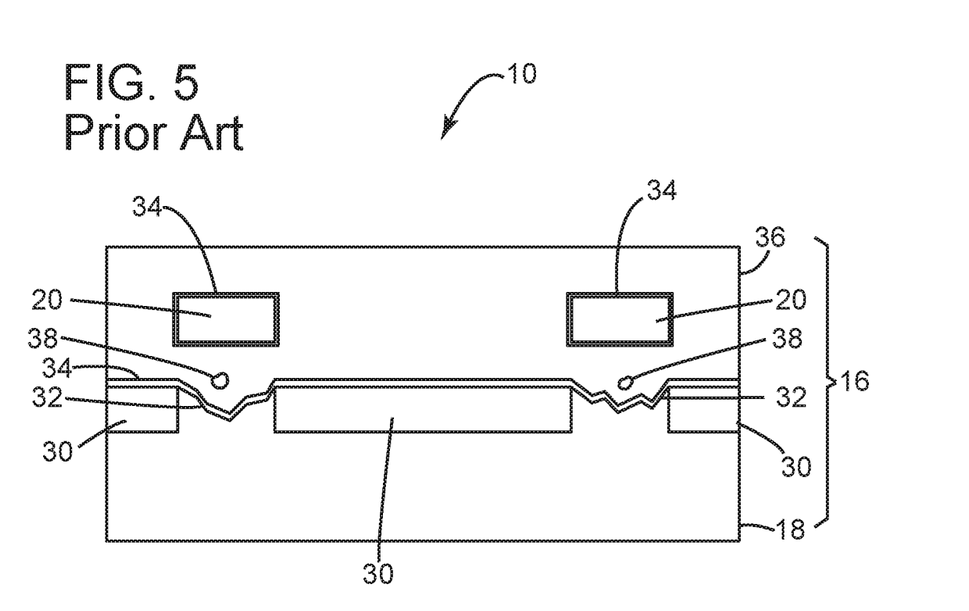
FIG. 5 is the cross sectional view of the channel region of the completed prior art GAA MOSFET structure.

Referring to FIG. 5, a gate dielectric 34 is disposed entirely around the nanowire channels 20, over the STI layers 30, and over trenches 30 recessed in substrate 18. The gate dielectric is preferably a high-k dielectric (with a high dielectric constant as compared to silicon dioxide). Examples of high-k dielectrics are hafnium silicate, zirconium silicate, hafnium dioxide, zirconium dioxide and the like. The high-k dielectric material is typically deposited using an atomic layer deposition process.

A gate metal is next disposed around the entirety of the dielectric 34 covered channels 20 and over the dielectric 34 covered STI layer 30 and substrate 18 to form the gate electrode 36 and complete the GAA MOSFET structure 10. The gate metal may be such metals as Tantalum (Ta), Tantalum Nitride (TaN), Niobium (Nb), Tungsten Nitride, Ruthenium Oxide and the like.

Problematically however, the deposition process in the area of the trenches 32 under the channels 20 is difficult to complete and irregular voids 38 are often formed. Moreover, the gate dielectric is very thin and sometimes does not adequately isolate the gate electrode 36 from the substrate 18. This is especially problematic at the rough bottoms of the trenches 32, where uniform deposition of the dielectric coating 34 is difficult to control. As a result, the potential for electrical shorts to occur across the dielectric 34 from gate 36 to substrate 18 is higher within the irregular shaped trenches 32.

FIGS. 6-9 illustrate various exemplary embodiments of a GAA MOSFET and methods of making the same in accordance with the present invention.

Figure 6:
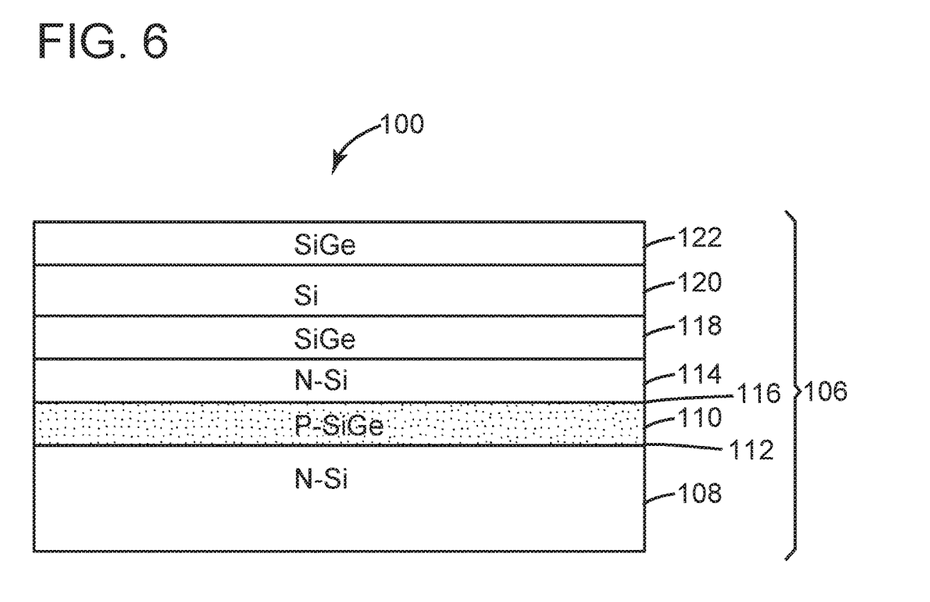
FIG. 6 is a cross sectional view of a GAA MOSFET structure at an intermediate stage of manufacturing in accordance with the present invention.

Referring to FIG. 6, a cross sectional view of a GAA MOSFET structure 100 at an intermediate stage of manufacturing in accordance with the present invention is presented. FIG. 6 is analogous to prior art FIG. 2B in that both illustrate cross sections through channel regions of their respective GAA MOSFETs after epitaxially grown layers have been disposed on the surface of a substrate and prior to fin formation.

In the specific case of FIG. 6, the GAA MOSFET structure 100 has a source region 102 (best seen in FIG. 8B) and a drain region 104 (best seen in FIG. 8B) interconnected by a channel region 106. The channel region 106 includes a silicon substrate 108, which, for this particular exemplary embodiment, is doped with an n-type dopant, such as phosphorus, arsenic or the like, to provide an n-type semiconductor material.

Even though this example illustrates an n-type Si substrate, the substrate 108 could also have been doped with a p-type dopant, such as boron, gallium or the like. The substrate 108 could also have been of a material other than Si, such as germanium (Ge), silicon germanium (SiGe) or the like.

Advantageously, an etch stop-electric well (ESEW) layer 110 is disposed over the surface of the substrate 108. ESEW layer 110 is doped with a p-type dopant since the substrate 108 is doped n-type. That is, if the substrate 108 is be doped with one of an n-type and a p-type dopant, then the ESEW layer 110 will be doped with the other of the n-type and p-type dopant. In this way, an n-p junction or a p-n junction is formed at the common boundary 112 between the substrate 108 and the ESEW layer 110. The n-p junction (or n-p junction) induces a depletion region which functions as an electric voltage barrier (or electric well) to any leakage current from ESEW layer 110 to substrate 108.

The ESEW layer 110 is also composed of a different material than the substrate 108. In this exemplary embodiment, the substrate 108 is Si and the ESEW layer is composed of SiGe. This is done so that the ESEW layer 110 not only functions as an electric well opposing current leakage to the substrate 108, but also advantageously functions as an etch stop that protects the substrate during any selective etching process of structure 100.

Though in this embodiment SiGe was selected as the material composition for the ESEW layer 110, one skilled in the art would recognize that many other materials can be used. However, the material for the ESEW layer 110 should be different enough from the material of the substrate 108 such that the ESEW layer will not readily etch, or preferably not etch at all, during an etching process that would readily etch the substrate.

A sacrificial layer 114 is disposed over the top surface of the ESEW layer 110. Sacrificial layer 114 is typically composed of a very similar material to that of the substrate 108, and, therefore, is composed of a very different material to that of the ESEW layer 110. In this embodiment, the sacrificial layer 114 is composed of Si, the exact same material as the substrate 108. As a result, the sacrificial layer 108 can be removed through selective etching, such as wet etching, while the ESEW layer 110 functions as an etch stop during the etching process.

Advantageously, the sacrificial layer 114 is also doped with the same type dopant as the substrate 108. In this exemplary embodiment, both the sacrificial layer 114 and substrate 108 are doped with an n-type dopant. As a result, an additional n-p junction is set up at the common boundary 116 between sacrificial layer 114 and the ESEW layer 110. Accordingly, and additional electric well (or electric voltage barrier) is formed which further opposes any leakage current to the substrate 108. Indeed, the common boundaries 116 and 112 between the sacrificial layer 114, the ESEW layer 110 and the substrate 108 collectively form an n-p-n junction, which strongly resists leakage current or potential shorts to the substrate 108.

One skilled in the art would recognize that if the substrate 108 were doped with a p-type dopant, then the ESEW layer 114 would necessarily be doped with an n-type dopant and the sacrificial layer would also necessarily be doped with a p-type dopant. As a result, a p-n junction would be induced at boundary 116, and a p-n-p junction would be induced collectively across boundaries 116 and 112.

A channel layer 118, similar in material composition to the ESEW layer 110, is disposed over the sacrificial layer 114. In this embodiment, channel layer 118 is composed of SiGe, which is the same material as the ESEW layer 110. Disposed over the channel layer 118 is a second sacrificial layer 120 composed of Si, and disposed over the second sacrificial layer 120 is a second channel layer 122 composed of SiGe.

Though this embodiment shows two epitaxially grown sacrificial layers 114 and 120 alternating between two epitaxially grown channel layers 118 and 122, one skilled in the art would recognize that any plurality of alternating sacrificial layers and channel layers may be disposed over the ESEW layer. What is highly preferable is that the sacrificial layers be of the same material composition, and the channel layers be of the same material composition. Additionally, the sacrificial layers must be composed of a different material than that of the channel layers in order to be able to selectively etch away the sacrificial layers while leaving the channel layer intact.

Figure 7:
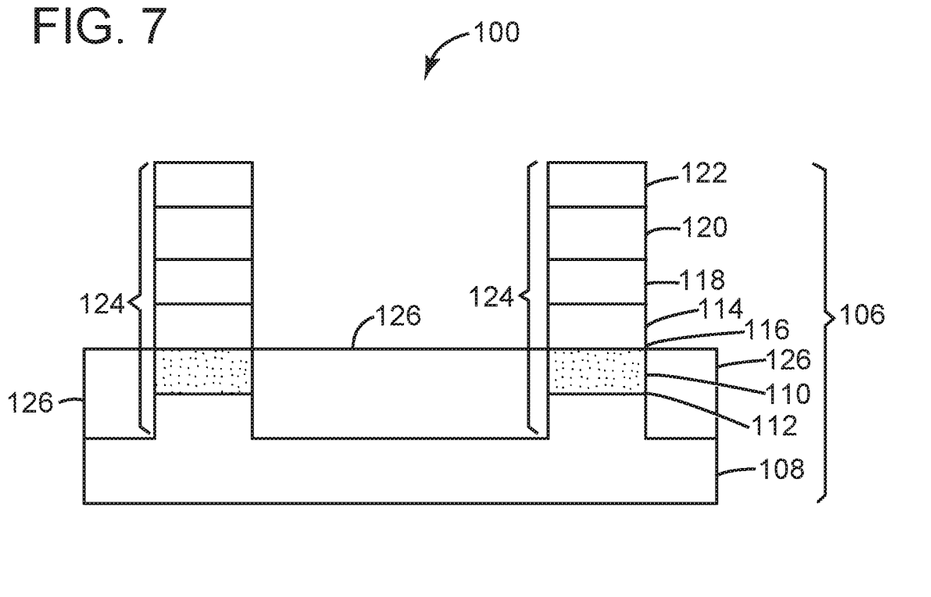
FIG. 7 is a cross sectional view of FIG. 6 further patterned in the channel region to form a pair of fins in accordance with the present invention.

Referring to FIG. 7, in a similar process to that illustrated in prior art FIG. 3, the GAA MOSFET 100 has been further patterned in the channel region 106 to form a pair of fins 124 out of the channel layers 122 and 118, the sacrificial layer 120 and 114, the ESEW layer 110 and a portion of the substrate 108. Additionally a plurality of STI layers 126 have been disposed between the fins 124 to prevent current leakage there between. Though two fins 124 have been patterned in this embodiment, one skilled in the art would recognize that any plurality of fins may be patterned in the channel region 106.

Figure 8A:
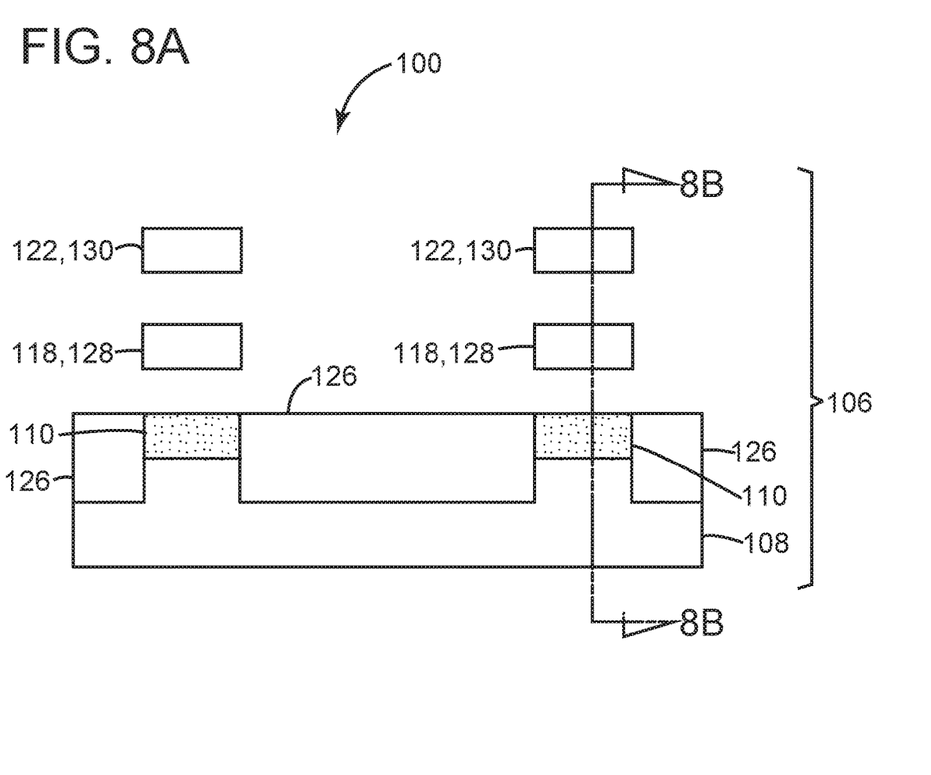
FIG. 8A is a cross sectional view of FIG. 7 after selective removal of sacrificial layers in accordance with the present invention.
Figure 8B:
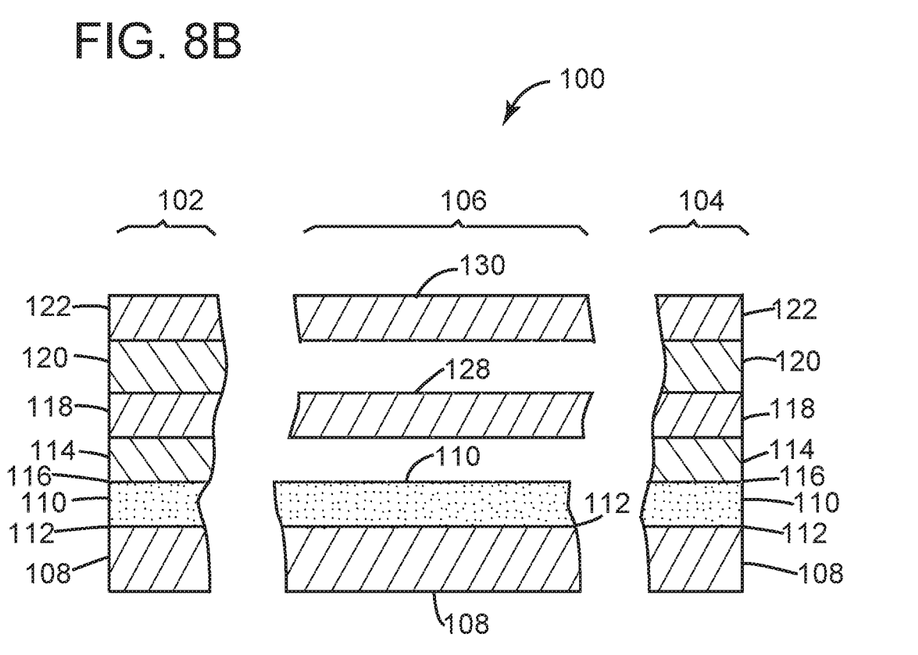
FIG. 8B is a cross sectional view of GAA MOSFET structure 100 taken along sectional line 8B-8B of FIG. 8A.

Referring to FIG. 8, in a similar process to that illustrated in prior art FIG. 4, a wet etch process is utilized to selectively remove the remainder of the sacrificial layers 114 and 120 from under the portions of the channel layers 118 and 122 that are in the channel region 106. The now suspended portions of the channel layers 118 and 122 in the channel region 106 function as nanowire channels 128 and 130 (best seen in FIG. 8B.

Advantageously however, and very much unlike the process illustrated in prior art FIG. 4, the ESEW layer 110 has functioned as an etch stop during the etching process to prevent etching of trenches in the substrate 108 or ESEW layer 110. Therefore, the ESEW layer 110 of the GAA MOSFET structure 100 is free of any trenches under the nanowire channels 128 and 130. This now very uniform structure helps to prevent performance irregularities between devices in the GAA MOSFET structure 100.

Referring to FIG. 8B, a cross sectional view of GAA MOSFET structure 100 taken along sectional line 8B-8B is presented. The cross section is through the nanowire channels 128 and 130 of one of the fins 124.

In this exemplary embodiment, the source 102 and drain 104 regions have the same structure. They source and drain regions 102, 104 include the substrate 108 having the protective ESEW layer 110 disposed over it. The sacrificial layer 114 is still intact and is disposed over the ESEW layer 110. The channel layer 118 is disposed over the sacrificial layer 114. The second sacrificial layer 120 is disposed over the channel layer 118 and the second channel layer 122 is disposed over the second sacrificial layer 120. The source and drain regions 102 and 104 are illustrated as being planar in shape, but may be patterned into other shapes, such as fin shaped, as well.

The common boundary 112 is located in the source 102, the drain 104 and the channel 106 regions, and provides an n-p or a p-n junction which forms an electric well opposing current leakage to the substrate 108 in all three regions. The sacrificial layers, especially the n-type doped sacrificial layer 114, provide an added electrical well at the common boundary 116 in the source 102 and drain 104 regions. Therefore the sacrificial layers 114 and 120 are not usually removed from the source and drain regions 102 and 104.

However, under some applications it is possible that it may be advantageous to remove all or a portion of the sacrificial layers 114 and 120 in the source 102 and drain 104 regions. For example, to promote greater surface contact between metal and the source and drain semiconductor materials.

In the channel region 106, the now suspended nanowire channels 130 and 128 extend horizontally relative to the substrate 108 across the entire channel region. The channels 130 and 128 are anchored to the channel layers 122 and 118 in the source 102 and drain 104 regions of structure 100.

Figure 9:
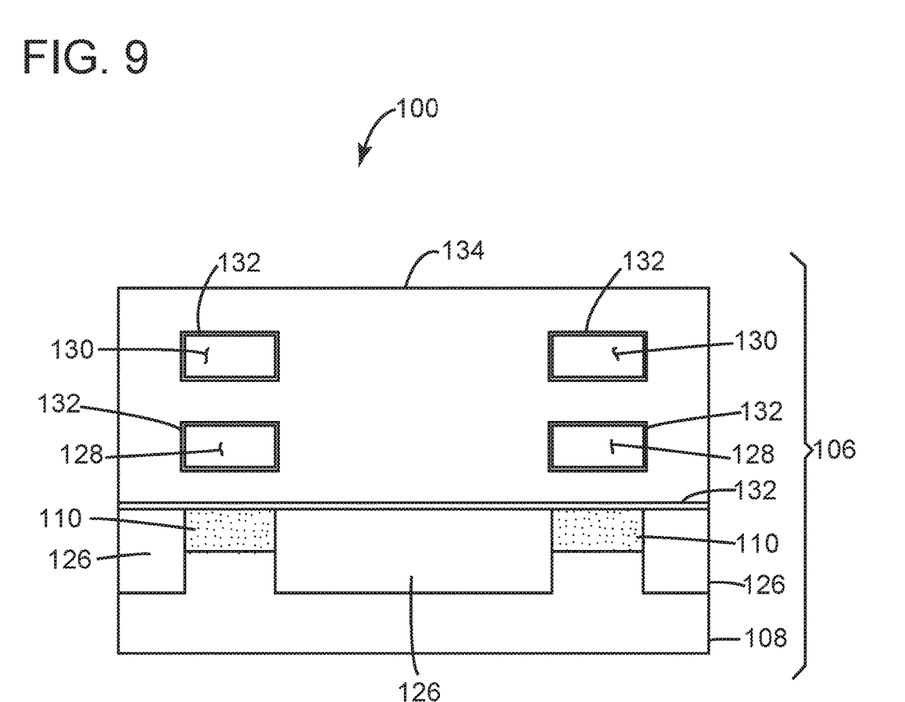
FIG. 9 is a cross sectional view of the channel region of the completed GAA MOSFET structure in accordance with the present invention.

Referring to FIG. 9, a cross sectional view of the channel region 106 of the completed GAA MOSFET structure 100 in accordance with the present invention is presented. In a similar process to that illustrated in prior art FIG. 5, a gate high-k dielectric 132 is disposed entirely around the nanowire channels 128 and 130, over the STI layers 126, and over the ESEW layer 110. A gate metal is next disposed around the entirety of the dielectric 132 covered channels 128 and 130 and over the dielectric 132 covered STI layer 126 and ESEW layer 110 to form the gate electrode 134 and complete the GAA MOSFET structure 100.

Advantageously however, and very much unlike the process illustrated in prior art FIG. 5, the ESEW layer 110 has functioned as an etch stop during the etching process to prevent etching of trenches in the substrate 108 or ESEW layer 110. Therefore, the ESEW layer 110 of the GAA MOSFET structure 100 is free of any trenches under the nanowire channels 128 and 130.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a substrate having source, drain and channel regions for a GAA MOSFET, the substrate doped with one of a p-type and an n-type dopant;
   disposing an etch stop-electric well (ESEW) layer over an entire top surface of the substrate in the channel region, the ESEW layer doped with the other of the p-type and the n-type dopant;
   disposing a sacrificial layer over an entire top surface of the ESEW layer such that the sacrificial layer is separated from the substrate by the ESEW layer in the channel region, the sacrificial layer doped with the same type dopant as the substrate;
   disposing a channel layer over an entire top surface of the sacrificial layer in the channel region;
   patterning a fin out of the ESEW layer, sacrificial layer, and channel layer in the channel region; and
   selectively etching away only the sacrificial layer of the fin to form a nanowire from the channel layer of the fin while the ESEW layer of the fin functions as an etch stop barrier to prevent etching of trenches in the channel region of the substrate.

2. The method of claim 1 comprising forming one of a p-n junction and an n-p junction at a common boundary between the ESEW layer and the substrate.

3. The method of claim 1 comprising forming one of a p-n junction and an n-p junction at a common boundary between the sacrificial layer and the ESEW layer in the source region.

4. The method of claim 1 comprising forming one of a p-n junction and an n-p junction at a common boundary between the sacrificial layer and the ESEW layer in the drain region.

5. The method of claim 1 comprising forming one of a p-n-p junction and an n-p-n junction at common boundaries between the sacrificial layer, the ESEW layer and the substrate in the source and drain regions.

6. The method of claim 1 comprising:
   the ESEW layer composed of a different material than the substrate and sacrificial layer; and
   the channel layer composed of a different material than the sacrificial layer.

7. The method of claim 6 wherein the ESEW layer and the channel layer are composed of the same material.

8. The method of claim 6 wherein the sacrificial layer and the substrate are composed of the same material.

9. The method of claim 1 comprising patterning fin shaped source and drain regions from channel layer, sacrificial layer and ESEW layer.

10. The method of claim 1 comprising patterning planar source and drain regions from the channel layer, sacrificial layer and ESEW layer.

11. The method of claim 1 wherein patterning a fin in the channel region comprises patterning a plurality of fins in the channel region.

12. The method of claim 1 comprising:
   disposing a plurality of alternating sacrificial layers and channel layers over the ESEW layer;
   patterning a fin out of the ESEW layer, sacrificial layers and channel layers in the channel region; and
   selectively etching away only the sacrificial layers of the fin to form a plurality of nanowires from the channel layers of the fin.

13. The method of claim 1 comprising:
disposing a gate dielectric coating over the nanowire and the ESEW layer in the channel region; and
disposing a gate metal over the dielectric coating to form a gate electrode of the GAA MOSFET.

* * * * *